(12) United States Patent
Loverich et al.

(10) Patent No.: US 9,106,160 B2
(45) Date of Patent: Aug. 11, 2015

(54) MONOLITHIC ENERGY HARVESTING SYSTEM, APPARATUS, AND METHOD

(71) Applicant: KCF TECHNOLOGIES, INC., State College, PA (US)

(72) Inventors: Jacob J. Loverich, State College, PA (US); Richard T. Geiger, Eugene, OR (US); Stephen J. Wenner, Port Matilda, PA (US)

(73) Assignee: KCF TECHNOLOGIES, INC., State College, PA (US)

( * ) Notice: Subject to any disclaimer, the term of this patent is extended or adjusted under 35 U.S.C. 154(b) by 384 days.

(21) Appl. No.: 13/731,739

(22) Filed: Dec. 31, 2012

(65) Prior Publication Data

US 2014/0184024 A1    Jul. 3, 2014

(51) Int. Cl.
*H02N 2/00*     (2006.01)
*H01L 41/113*   (2006.01)
*H02N 11/00*    (2006.01)

(52) U.S. Cl.
CPC ................. *H02N 11/002* (2013.01)

(58) Field of Classification Search
USPC ................................. 310/329, 339
See application file for complete search history.

(56) References Cited

U.S. PATENT DOCUMENTS

| | | |
|---|---|---|
| 3,463,942 A | 8/1969 | Mellon |
| 4,320,477 A | 3/1982 | Baumgartner |
| 4,360,860 A | 11/1982 | Johnson et al. |
| 4,504,761 A | 3/1985 | Triplett |
| 4,631,921 A | 12/1986 | Linderfelt |
| 6,407,484 B1 | 6/2002 | Oliver et al. |
| 6,433,465 B1 | 8/2002 | McKnight et al. |
| 6,856,291 B2 | 2/2005 | Mickle et al. |
| 6,858,970 B2 | 2/2005 | Malkin et al. |
| 6,882,128 B1 | 4/2005 | Rahmel et al. |
| 6,933,655 B2 | 8/2005 | Morrison et al. |
| 6,938,311 B2 | 9/2005 | Tanielian |
| 7,116,036 B2 | 10/2006 | Balasubramaniam et al. |
| 7,293,411 B2 | 11/2007 | Fitch et al. |
| 7,446,459 B2 | 11/2008 | Xu et al. |
| 7,521,841 B2 | 4/2009 | Clingman et al. |
| 2010/0084947 A1* | 4/2010 | Yoon et al. ................. 310/339 |
| 2012/0206016 A1* | 8/2012 | Ayazi et al. ................ 310/339 |
| 2013/0241211 A1* | 9/2013 | Yagi .......................... 290/1 E |
| 2013/0249350 A1* | 9/2013 | Fujimoto .................... 310/332 |
| 2013/0293069 A1* | 11/2013 | Sakaguchi et al. ........ 310/348 |
| 2014/0077662 A1* | 3/2014 | Lueke et al. ............... 310/339 |
| 2014/0159547 A1* | 6/2014 | Jun et al. ................... 310/339 |

* cited by examiner

Primary Examiner — Thomas Dougherty
(74) Attorney, Agent, or Firm — Oliff PLC

(57) ABSTRACT

An energy harvesting device utilizing a monolithic, mesoscale, single-degree-of-freedom inertial based resonator in which the support structure, beam-spring, and proof mass are a single component without joints, bonds, or fasteners. Frequency tuning features include holes in the proof mass in which mass can be added to change the devices resonance frequency as well as levers which add curvature to the beam-spring system and adjust system stiffness. Robustness is increase by designing the resonator to exhibit nonlinear behavior such that its power density is maximized for low vibration amplitudes and minimized for high amplitudes. The device structural resonance modes are designed to be much higher than the resonators proof mass-spring resonance frequency. Electromechanical transducers are used to convert the resonators mechanical energy to electrical energy. Electrical circuitry is included to extract and condition the electrical charge.

16 Claims, 16 Drawing Sheets

MONOLITHIC ENERGY HARVESTING SYSTEM, APPARATUS, AND METHOD

GOVERNMENT LICENSE RIGHTS

This invention was made with United States government support under U.S. Navy SBIR Award No. N00014-09-C-0139. The government has certain rights in this invention.

CROSS-REFERENCE TO RELATED APPLICATION

The present disclosure is related to copending U.S. patent application Ser. No. 13/731,694, entitled "Wireless Energy Harvester Power Accelerometer", filed concurrently with the present application, the disclosure of which is incorporated herein by reference.

TECHNICAL FIELD

The present disclosure relates generally to apparatuses and methods for generating electricity by induced vibration and, more specifically, to an apparatuses and methods for generating electrical energy with a monolithic meso-scale inertial-based energy harvesting device having a beam spring structure.

BACKGROUND

Energy harvesters are devices that generally extract a fraction of energy flowing as a result of other systems' or environments' operational conditions. For example, a photovoltaic harvester converts solar radiation to electrical current that can be used to operate a sensor. Typical sources of energy flow include mechanical straining, fluid movement, electromagnetic radiation (solar and other RF), thermal gradients, and vibration. Energy harvesters use a transducer to convert an energy flow into electrical power that can be stored or applied to an electrical load. A circuit compliments the transducer for optimally extracting electrical energy form the transducer, storing that energy, and delivering it to the load at a fixed voltage under varying loads.

Prior art in the general field of energy harvesting encompasses a variety of different transducers that can be used to convert the energy flow into electrical power. These transducers range from electromagnetic generators driven by mechanical hand cranks (U.S. Pat. No. 4,360,860) to piezoelectric transducers used to extracted energy from varying centripetal force (U.S. Pat. No. 3,463,942) to antennas used to harness electromagnetic energy in the radio frequency band (U.S. Pat. No. 6,882,128). Novel materials such as electrostrictive polymers are new enabling energy harvesting transducers that expand the range of potential applications (U.S. Pat. No. 6,433,465).

Some of the most relevant prior art in the field of energy harvesting describe the method or mechanism to impedance match the energy flow to the transducer. For example a Helmholtz resonator can be used in an acoustic energy harvester to amplify force applied to a piezoelectric harvester (U.S. Pat. No. 7,116,036), a resonant circuit can be coupled to an antenna for enhancing RF harvesting (U.S. Pat. No. 6,856,291), and a force amplification mechanism that matches a typical compressive load to the unusual high load, but low displacement actuation properties of piezoelectric materials (U.S. Pat. No. 7,446,459).

Other prior art includes specific application of energy harvesting to particular devices and systems. Small scale applications include solar, thermal, and vibration harvesting for powering time pieces (U.S. Pat. No. 4,320,477) and miniature wireless switches for vehicle door locks (U.S. Pat. No. 6,933,655). Larger scale applications include piezoelectric elements in a tire tread for vehicle health monitoring (U.S. Pat. No. 4,504,761) and harvesters for extracting energy from wave motion to power electronics on buoys (U.S. Pat. No. 4,631,921).

The invention presented herein improves upon the prior art in the particular field of piezoelectric vibration energy harvesting. Vibration energy harvesters are generally dynamic systems that have an inertial proof mass suspended by a spring connecting the mass to a mounting base. The mounting base is generally rigidly attached to a host structure. Vibration of the host structure is resisted by the inertial proof mass causing deformation of the spring. In the case of piezoelectric vibration harvesters, the spring is instrumented with piezoelectric materials so that spring deformation strains the piezoelectric material which in turn generates electrical charge. The electrical charge can then be extracted from the piezoelectric element and stored.

In many applications the host structure has a periodic and fixed frequency feature of its vibration that enables tailoring the harvester to operate optimally for one particular condition. In particular, the spring and mass can be adjusted so that they resonate at the fixed input frequency.

Harvester cost and power density (power output per unit mass) are the two most important metrics that define their value for most practical applications. The cost is typically a function of the fabrication methods and device size scale. The power density is dictated by the following expression:

$$\bar{P} = \frac{m_p \delta_e V^2 \omega}{4(\delta_e + \delta_m)^2 (m_p + m_s)},$$

where the proof mass is $m_p$, the supporting structure for the proof mass is $m_s$, the base vibration velocity amplitude is V, the vibration frequency is $\omega$, $\delta_e$ is the electrical damping caused by energy harvester transducer, and $\delta_m$ is the parasitic mechanical damping.

The frequency and vibration amplitude are generally fixed by the application. The proof mass is typically much larger than the structure mass and so the power density generally does not depended on mass the harvester. The remaining parameters that strongly influence the power density are the mechanical and electrical damping. According to the power density expression, for a given mechanical damping there will be an optimal electrical damping. However, higher mechanical damping always diminishes the power density and since it is often greater than the electrical damping, it becomes the critical parameter for determining a harvester's power density.

The parasitic damping is primarily dictated by the device structural design and material section. Interfaces between discrete component such as fasteners, bonded joints, and press fits, are the primary source of parasitic damping.

Although prior art has not explicitly addressed power harvester design from this perspective, some inventions have features that indirectly minimize this issue for MEMS (Microelectromechanical system) scale devices. U.S. Pat. No. 6,858,970 shows a plurality of beams, masses, and piezoelectric members disposed in one assembly. U.S. Pat. No. 6,938,311 describes a similar multi mass system with additional features such as a sheath to hold the masses and a deflection limiter. The multi-beam system minimizes parasitic damping by using a single substrate for all the beams. This single substrate monolithic construction is typical of all MEMS devices that use IC processes for fabrication. The circuitry for the energy extraction and condition can also be included on a single monolithic chip (U.S. Pat. No. 6,407,484). However, MEMS devices have limited applicability in real applications due to robustness, limited power density, deposition of piezoelectric thin films, and squeezes film damping.

A secondary, but similarly important, drawback of the interface between discrete components is variability in the system stiffness. Variability in stiffness is important because the harvester's resonance frequency (primarily dictated by its proof mass and spring stiffness) is designed to match a host structure's fixed base excitation vibration frequency. A miss match due to variation in the component interfaces strongly influences the device performance. In addition, component interfaces tend to change over time in response to periodic mechanical strain which in turn causes the harvester frequency to drift.

Prior art describing frequency tuning includes a mechanism in U.S. Pat. No. 7,521,841 and a movable fluid bead in U.S. Pat. No. 7,293,411 that adjusts the system's stiffness and mass.

The harvester designs in the present state of the art do not sufficiently address the critical issues of component interfaces and associate frequency drift for devices that are fabricated on a macro size scale. A novel solution to these issues is presented in the following invention.

SUMMARY OF THE INVENTION

The following definitions apply to this disclosure. The term "monolithic" refers to the basic structure of the harvester for which no discontinuous physical property changes exist throughout the structure. This doesn't constrain the structure to a single homogeneous material. Anisotropy of and variations in material properties can exist within the monolithic structure. "Mesoscale" is a general term that refers to the basic size and fabrication methods for the structure. Mesoscale is used here to distinguish this device from ones that are fabricated using microscale processes that are typical for creating micro electro-mechanical systems (MEMS). Mesoscale devices are constructed using conventional machining methods such as milling, turning, electro discharge machining (EDM), forming, extrusions, and stamping versus etching, sputtering, vapor deposition, and photolithography. The "proof mass" is an inertial mass that behaves as an ideal discrete mass for the frequency range in which the harvester operates.

In one aspect of the disclosure, a single degree of freedom resonator device uses a monolithic construction in which a mesoscale support structure, spring, and proof mass are a single component without joints, bonds, or fasteners. An energy harvester functions similarly to most inertial-based harvesters in that it is an auxiliary system that extracts a small amount of energy from a rapidly moving host structure. The host structures in such applications often have high structural impedance and consistent periodic movement. In this typical case, the harvester uses mechanical resonance to maximize the harvested energy and more specifically its power generation density. A basic single degree of freedom resonator is defined by a combination of stiffness, mass, and damping properties. The square root of the ratio of the spring stiffness to the proof mass defines the resonance frequency. The force and displacement amplification at resonance is primarily defined by the damping relative the mass and stiffness.

According to some aspects, the primary elements of a resonator are fabricated using a single monolithic piece of material. Such a resonator can increase the lifespan of an energy harvester and can provide cost reductions based on using parallel fabrication techniques and reductions in assembly labor. The resonator may include frequency tuning features to improve the device functionality. Also robustness of the resonator may be improved by including nonlinearity features and designing structural resonance to be much higher than the resonator's resonance frequency.

One embodiment of the monolithic construction is a rectangular block of metal with regions of material removed so that a discrete mass is suspended relative to the main support base by thin beam structures. The suspended region of material represents a proof mass and the thin beam structures represent springs.

In another embodiment, the resonator may be configured to function as a vibration energy harvesting device. Electromechanical transducers may be attached to the resonator to convert the device's mechanical vibrations to electrical energy and electrical circuitry may be interfaced with the electromechanical transducers to extract or condition the electrical energy. These transducers may be piezoelectric elements, magnet and coil devices, or any other suitable means for converting mechanical energy to electrical energy. In this way the harvester can extract energy from a vibrating host structure.

In another embodiment, the resonance frequency of the resonator is tunable by adjusting the harvester stiffness.

In yet another preferred embodiment of the present disclosure, the resonator is designed to exhibit nonlinear behavior such that its power density can be maximized for low vibration amplitudes and minimized for high amplitudes. This behavior is advantageous for many industrial applications wherein there is a wide range of vibration amplitude but the output power is targeted for a specific load. To maximize applicability in this case, the nonlinearity offers a high level of sensitivity for low vibration levels and mechanical robustness for shock and high vibration levels.

In still another embodiment of the invention, the mounting base is designed such that its resonance mode dictated primarily by its structure is much higher than that of the resonators spring-proof mass resonance frequency. To achieve this, the base is designed to be stiff relative to its mass.

In another possible embodiment, the proof mass is designed to account for a majority of the resonator's volume. This reduces parasitic mass and ensures that the resonance frequency of the resonator is well below any modes that would be defined by the local structure of the proof mass.

In yet another embodiment, more than one spring-proof mass system may be formed from the same monolithic construction and configured in parallel to increase the systems peak energy harvesting bandwidth or to provide multiple preferred frequencies.

Energy harvesters according to the disclosure are an improvement over the state of the art in that the monolithic construction allows for reductions in fabrication cost, frequency tunability, and/or improved robustness.

DETAILED DESCRIPTION

Reference will now be made in detail to specific embodiments or features, examples of which are illustrated in the accompanying drawings. Generally, corresponding or similar reference numbers will be used, when possible, throughout the drawings to refer to the same or corresponding parts.

Figure 1:
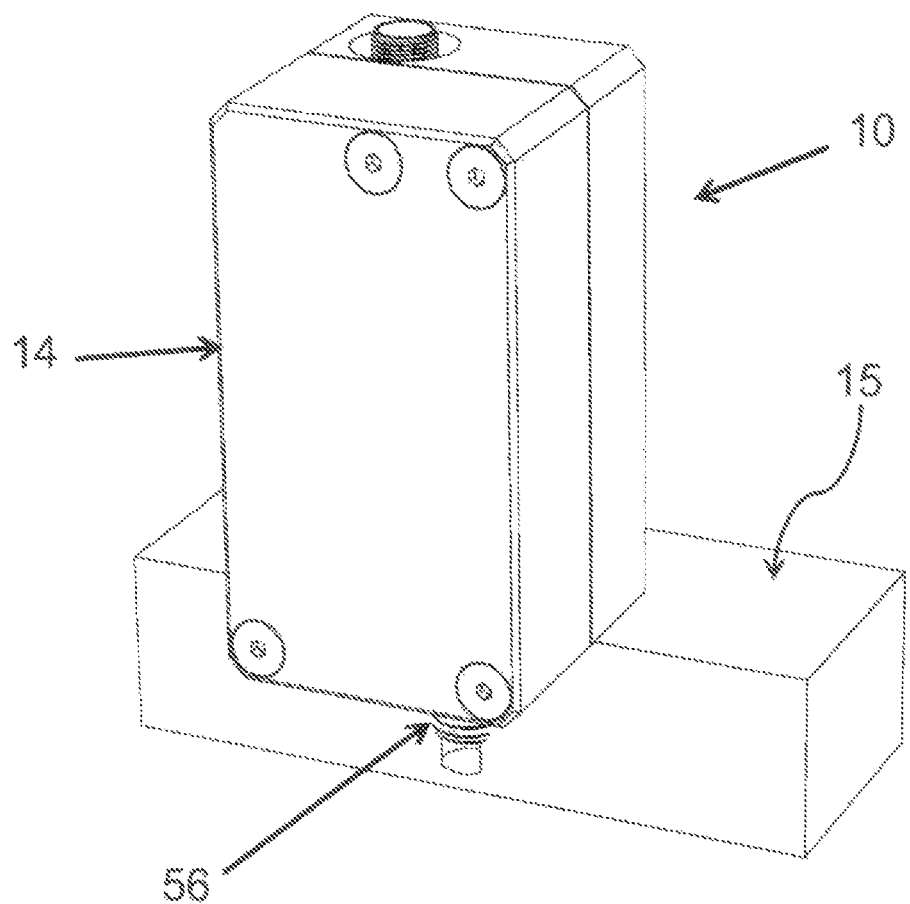
FIG. 1 shows an assembled version of an exemplary embodiment of an energy harvester in accordance with aspects of the disclosure.

FIGS. 1-8 illustrate an exemplary embodiment of an energy harvester 10 in accordance with various aspects of the disclosure. According to some aspects, as shown in FIG. 1, an exemplary energy harvester 10 may include a housing 14 and a coupling arrangement 56 for coupling the housing 14 to a host structure 15.

Figure 2:
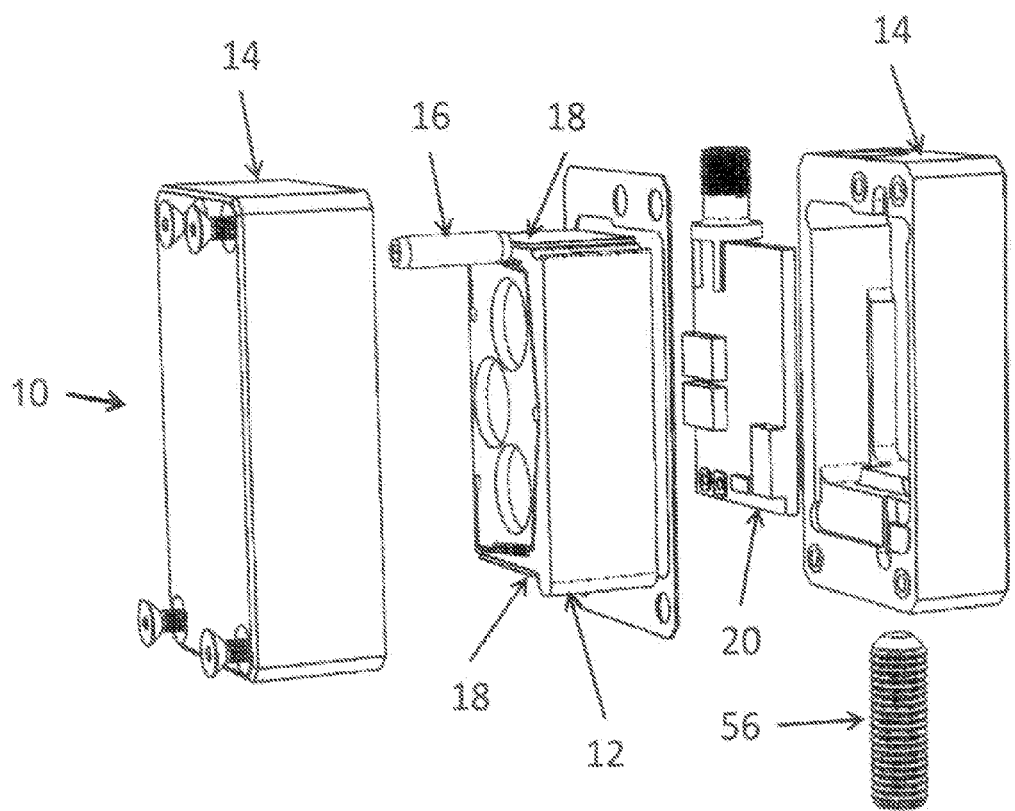
FIG. 2 is an exploded view of the exemplary embodiment in FIG. 1.
Figure 3:
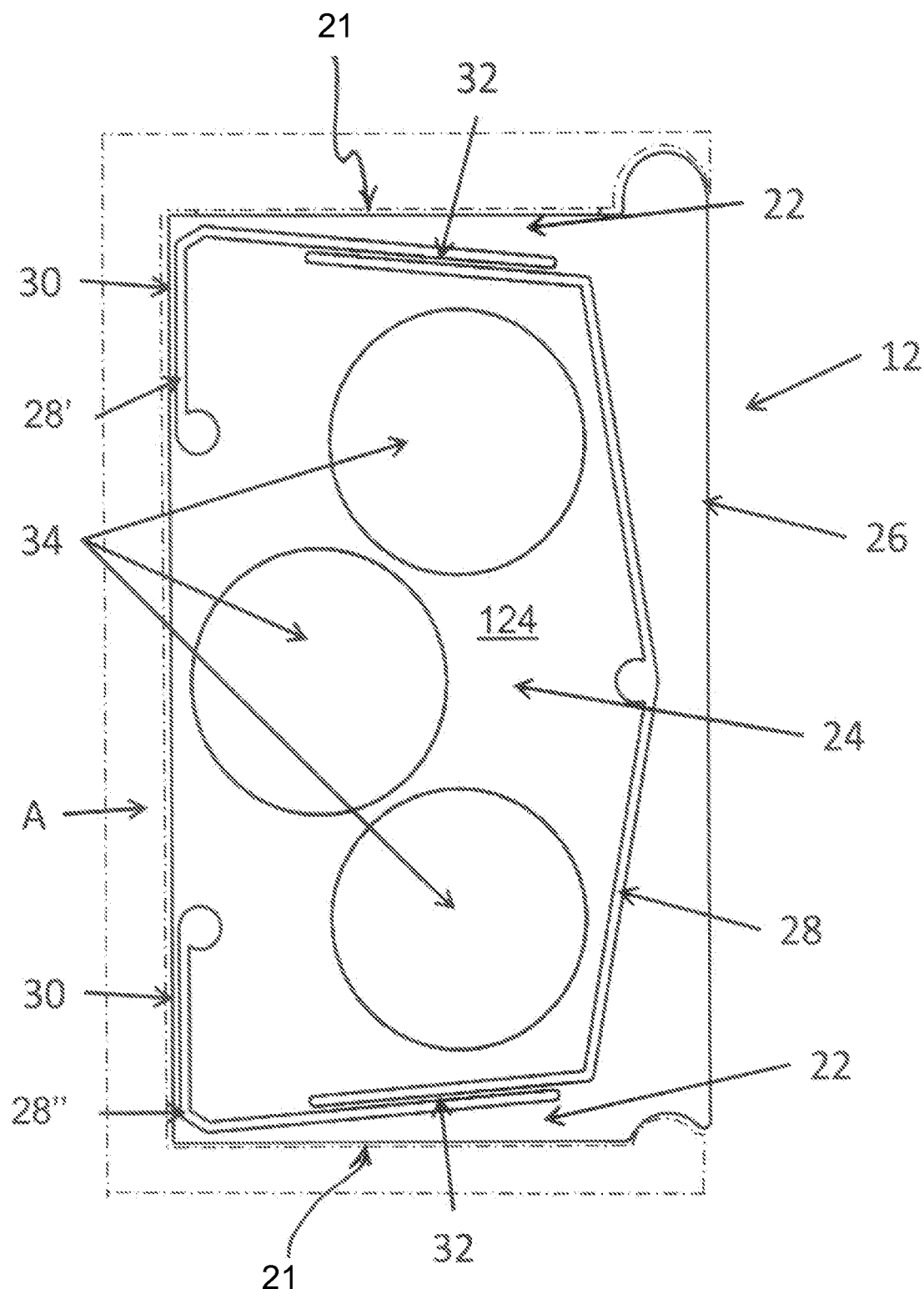
FIG. 3 is an embodiment of the monolithic resonator showing the construction process and the elements of the resonator.

Referring to FIG. 2, the energy harvester 10 may further include a single degree of freedom resonator 12, a pin 16 (described in more detail below), electro-mechanical transducers 18, and electronic circuitry 20. In an exemplary embodiment, the electromechanical transducers 18 are piezoelectric elements. Referring now to FIG. 3, in an exemplary embodiment the resonator 12 may be a monolithic single degree of freedom resonator. The resonator 12 may include a beam-spring 21, a proof-mass 24, and a backplane 26. The backplane 26 is relatively rigid in comparison with the beam-spring 21 To support the monolithic construction of the resonator, preferable methods of fabrication include removal of material from regions of a single piece of material or an extrusion that provides the proper geometry. Both methods provide a two dimensional structure that can be further shaped to the proper geometry with additional fabrication methods. For example, the material removal can be achieved using electric discharge machining (EDM), water jet cutting, laser cutting, or manual machining. In order to maximize power density of the resonator, a thin cutout in a rectangular C-shaped pattern, as shown by the dashed-dotted region A (FIG. 3), forms the resonator's profile.

During fabrication, channels 28, 28', 28" are removed from a monolithic block of material 15. For example, as shown in FIG. 3, three separate channels 28, 28', 28" may be removed from the monolithic block 15. These channels 28, 28', 28" run completely through the block of material and separate the elements of the resonator 12. The channels 28, 28', 28" define a body 124 of the proof mass 24, the rigid backplane 26, the beam-springs 21, and a plurality of flexures 30, 32.

Holes 34 can be created into the proof mass body 124 as mass receptacles. The holes 34 may be cylindrical, rectangular, or any other desired shape. The holes 34 can run completely or partially through the proof mass body 124. In some aspects, the proof mass body 124 may account for a majority of the proof mass 24. Other holes (not shown) can be added to the mounting base 14 to reduce its weight since it is a parasitic mass in the power density calculation. In some aspects, the holes 34 may be filled with additional mass (either greater than or less than the removed mass). In some aspects, additional mass may be fixedly coupled to the proof mass body 124 instead of or in addition to the holes 34. Thus, the number and size of holes 34 and/or the additional mass in the holes or secured to the proof mass body 124 may allow tunability of the resonator 12.

According to various aspects of the disclosure, an exemplary preferred sized of the harvester 10 may be 1 to 100 cubic centimeters in volume. The length to height aspect ratio and/or the width to height aspect ratio can range from 1 to 10. The material of the mounting base 14 may comprise, for example, a metal, a plastic, or a composite material. According to various aspects, it may be preferable that the base 14 comprise a material with low damping such as, for example, brass, steel, titanium, or aluminum or other metals.

Figure 4:
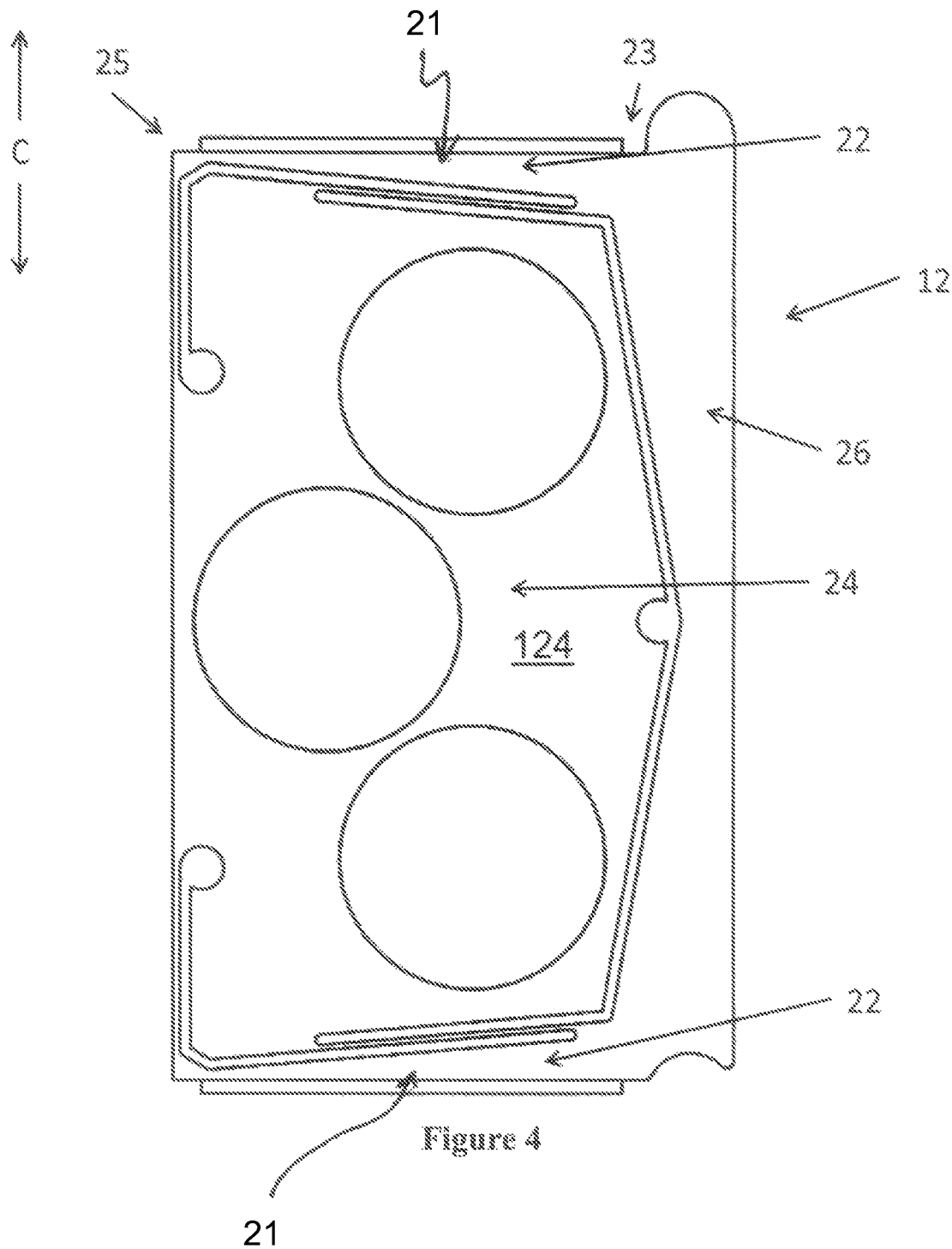
FIG. 4 is an embodiment of the monolithic resonator showing the elements of the monolithic resonator.

Referring now to FIG. 4, in an exemplary embodiment of the single-degree of freedom resonator 12, the beam-springs 21 comprise a pair of cantilevered beams 22 having a first end 23 and a second opposite end 25. The beams 22 are supported at the first end 23 by the rigid backplane 26 and are connected to the proof mass 24 at the second end 25 by a flexure 30. When the proof mass 24 causes the beam 22 to deflect in a direction parallel to the backplane 26 as shown by the arrows C, a spring return force is generated, which causes the beam 22 to return to the rest position.

Figure 5:
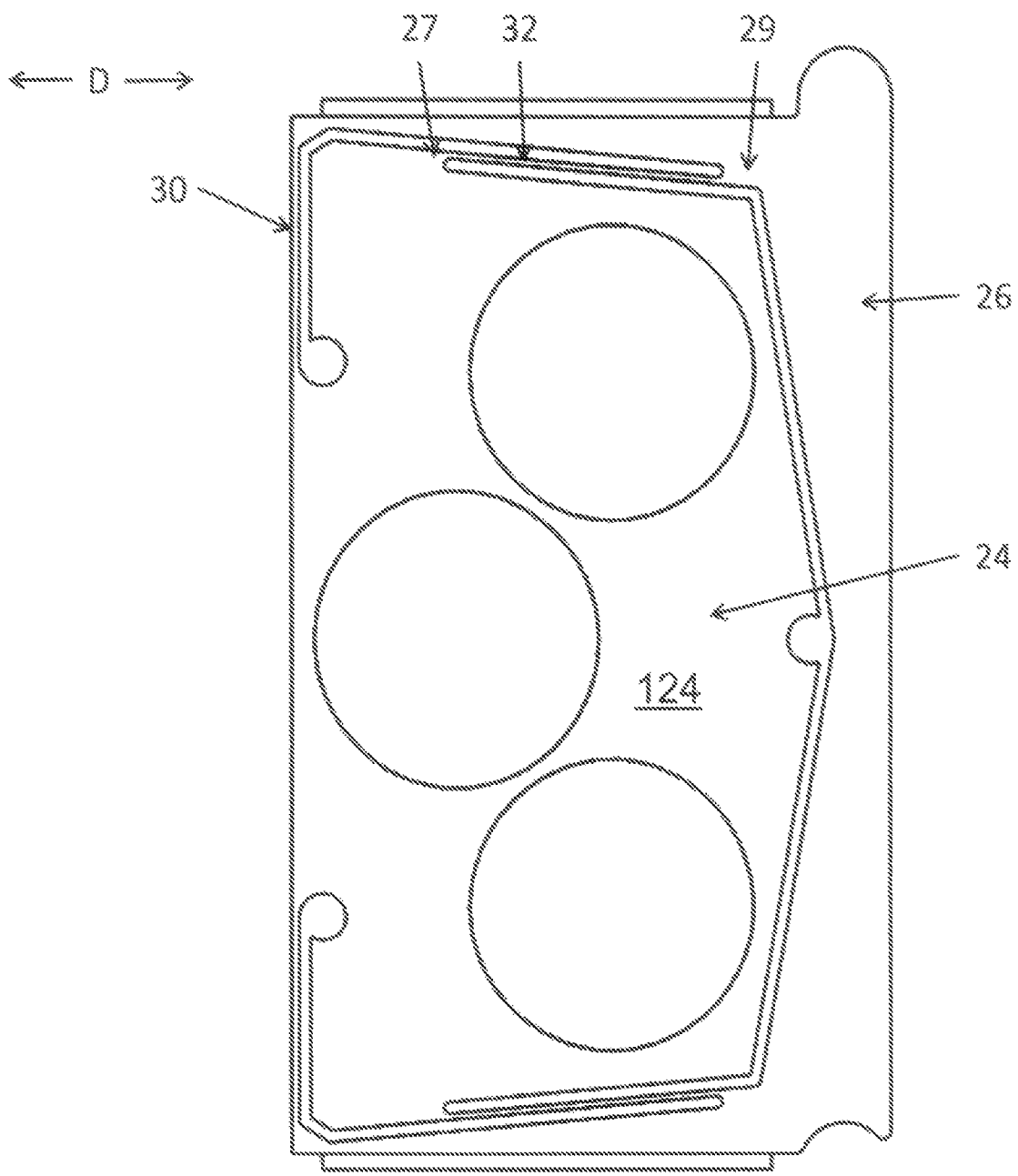
FIG. 5 is an embodiment of the monolithic resonator showing how the flexures connect the elements and restrict the movement of the proof mass.

Referring now to FIG. 5, in the current exemplary embodiment, flexures 30, 32 are used to connect various elements of the resonator 12. The flexures 30, 32 may perform similarly to hinge or pin joints with no slop and work to define the resonator's degree of freedom. The flexures 32 have a first end 27 and a second end 29. The first end 27 is connected to the proof mass 24 and the second end 29 is connected to the rigid backplane 26. These flexures 32 are anchored to the rigid backplane 26 and thus serve to restrict the proof mass 24 from moving in a direction parallel to the surface of the beam 22, as shown by arrows D. Such restricted motion would otherwise place the flexures 32 in compression or tension.

Figure 6:
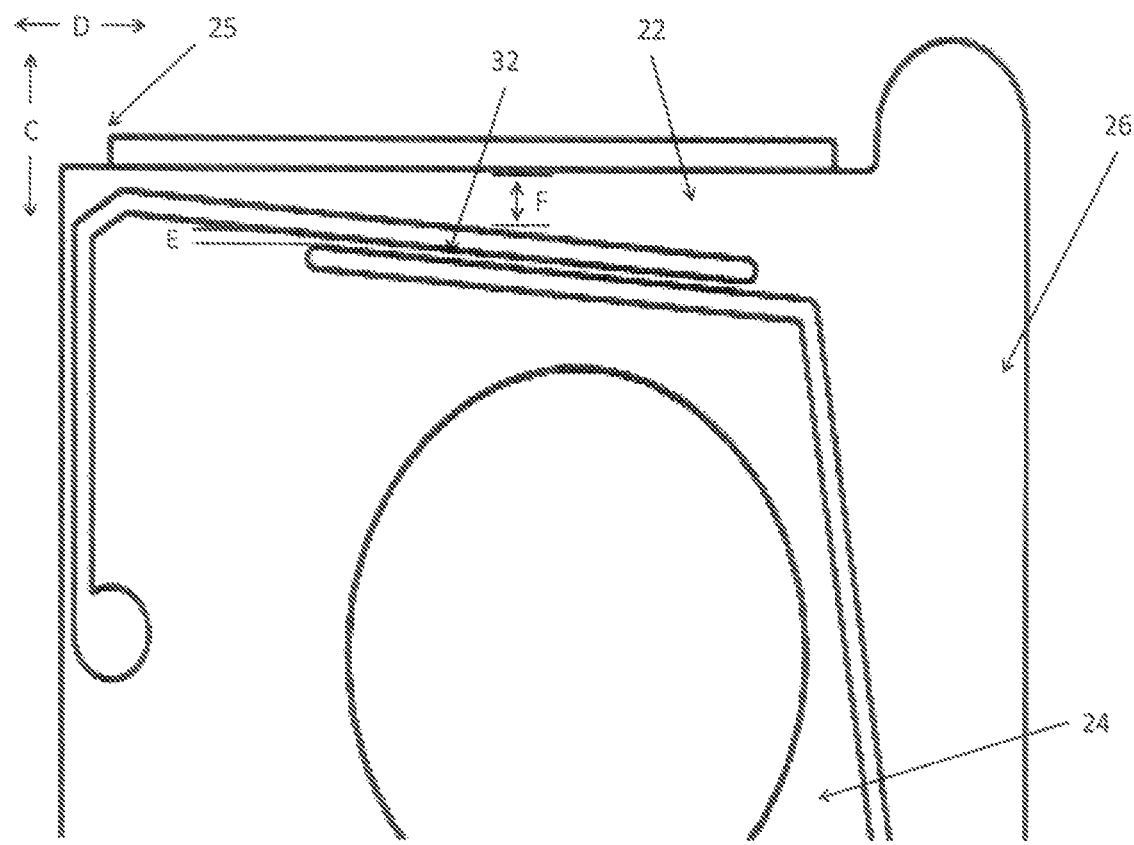
FIG. 6 is a cutaway of an embodiment of the monolithic resonator showing only half of the monolithic resonator and highlighting the geometry of the beam-spring, flexure, and proof mass system.

Referring now to FIG. 6, which shows only half of the resonator 12 and one flexure 32 for clarity, since a cross-sectional dimension of the flexure 32, as shown by the lines E, is small relative to the average cross-section of the beam 22, shown by the lines F, the flexure 32 bends easily and offers little resistance to motion of the proof mass in a direction that is normal to the surface of the beam 22, as shown by the arrows C. Hence, the stiffness of the flexures 32 is relatively low, adding only small amounts of stiffness to the beam-spring system 21.

Similarly, flexures 30 (FIG. 3) connect the proof mass 24 to the beam 22 at second end 25 where force and moment are only transmitted from the proof mass 24 to the open second end 25 of the cantilevered beam 22 in a direction normal to the surface of the beam 22, as shown by arrows C. With this setup, the stiffness of the resonator 12 in the direction normal to the surface of the beam 22, as shown by arrows C, is maximized while the stiffness of the resonator 12 in a direction parallel to the length of the beam 22, as shown by arrows D, is tailored to define the linearity of the spring stiffness.

Figure 7:
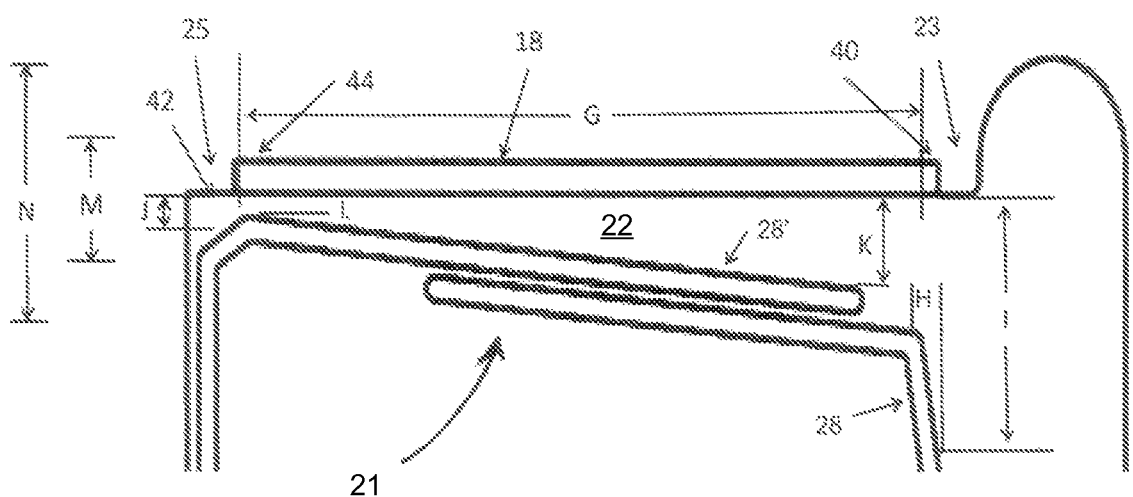
FIG. 7 is a cutaway of an embodiment of the monolithic resonator showing just the beam-spring system and highlighting its geometry and construction.

Referring to FIG. 7, which shows just the beam-spring system 21 for clarity, the cross-section F (FIG. 6) of the beam 22 in an exemplary embodiment of the resonator 12 is varied from a minimum value at the second end 25 to a maximum value at the opposite first end 23. The first end 23 is attached to the rigid backplane 26 so that as the proof mass 24 bends the beam 22, the surface strain distribution along the length G of the beam 22 is constant. The thickness of the beam 22 can be tapered according to the particular strain distribution and basic harvester geometry.

The beam-spring system 21 is designed such that strain discontinuities from the piezoelectric element 18 are located where the beam 22 is immobilized. The piezoelectric transducer 18 is positioned at the cantilevered first end 23 of the beam 22 such that the end 40 of the transducer 18 is on the rigid back plane side of channel 28, as shown by lines H. Thus, the end 40 of the piezoelectric element 18 nearest the back plane 26 is over a section of material having a cross-sectional dimension I, which is much larger than the cross-sectional dimension K of the beam 22 at the cantilevered first end 23 and is effectively immobilized. At the open second end 25 of the cantilevered beam 22, the flexure 30 and the beam 22 are connected via a tapered section 42 of material. Thus, the end 44 of the piezoelectric element 18 nearest the open second end 25 of the beam 22 is over a section of material with a cross-sectional dimension J, which is larger than the beams cross-sectional dimension L and is effectively immobilized. This geometry minimizes stress concentrations that can lead to fatigue cracks and, for the case in which a piezoelectric transducer 18 is used, it provides a substantially uniform strain distribution on the transducer 18, which can be relatively fragile.

For typical linear resonate systems, linear stiffness may be used to maximize the mechanical quality factor of the resonator 12. This linearity requires that the proof mass amplitude grows proportionally with increasing input vibration amplitude. In the case of high input vibration amplitudes, damage can occur due to excessive beam-spring deflection or impact of the proof mass with device mechanical packaging. Aspects of the disclosure overcome this because the boundary conditions of the beams 22 are designed such that the mode of deflection of the beams 22 changes from a pure bending mode for small displacements M to a combination of a bending and stretching mode for large displacements N. (The displacements M and N are illustrative only and not necessarily to scale.) The aforementioned transition occurs when the deflection of the beam is sufficiently high that tensile stress in the beam provides the primary restoring force rather than bending stress. For smaller displacements M, the beam-spring system operates similarly to a typical linear resonant system. For higher displacements N, the linear stiffness of the beam-spring system increases. This increased stiffness variation reduces the resonator's quality factor (Q) and alters the frequency of the transmissibility maxima. This behavior may be advantageous for many industrial applications where a high level of sensitivity is required for low vibration levels (i.e., a high Q system for low vibration) and mechanical robustness is desired for shock and high vibration levels (i.e., a low Q system for high vibration).

Figure 8:
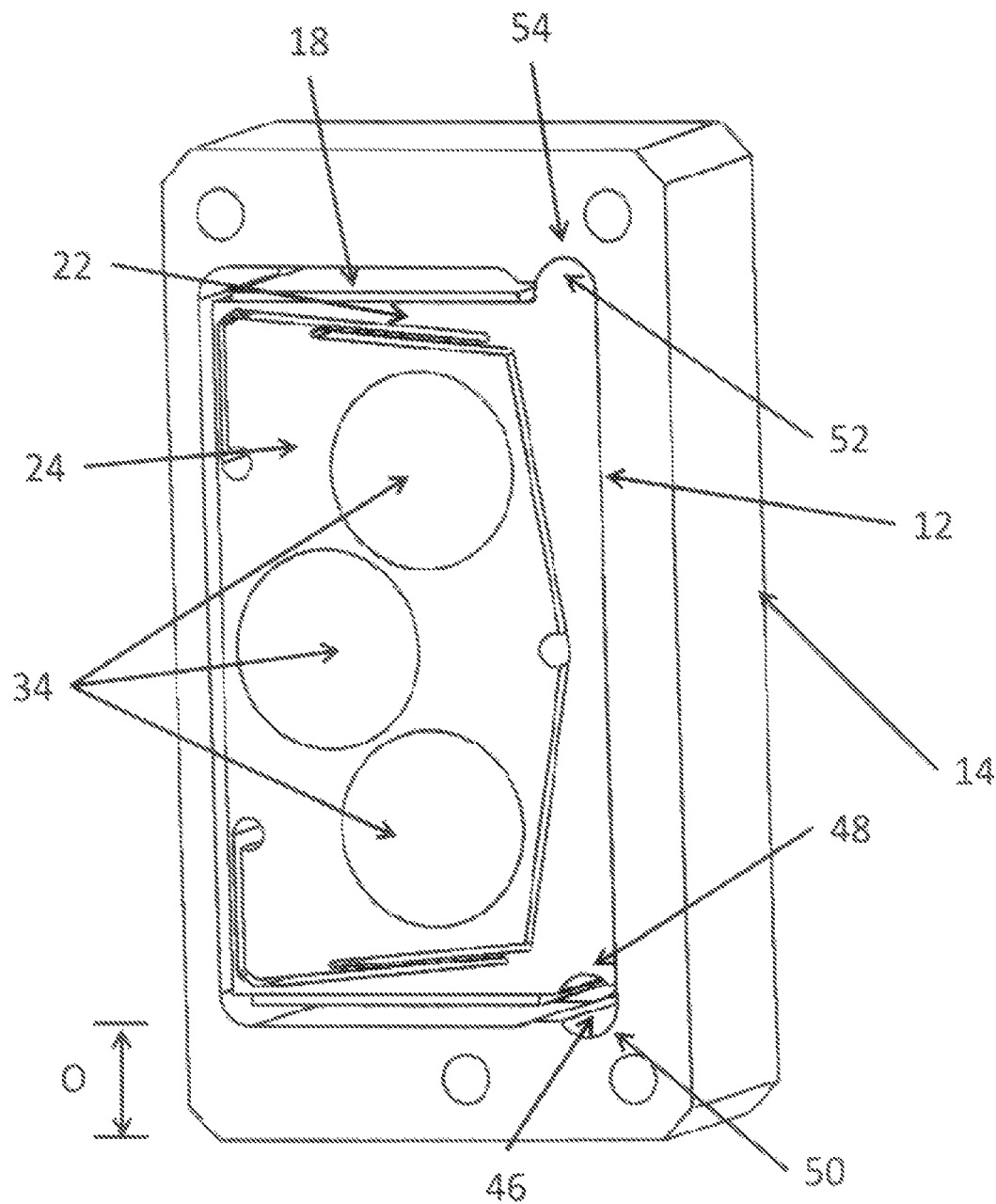
FIG. 8 is an embodiment of the energy harvester with resonator in its housing.

In an exemplary embodiment, as shown in FIG. 8, the proof mass 24 includes holes 34 as a mechanism for tuning the resonance frequency of the resonator 12 after manufacturing. Resonance frequency tuning may be particularly important in manufacturing where it may be undesirable to adhere to tight tolerances and specific fabrication methods which are required for achieving a precise resonance frequency. For an energy harvester 10 with a typical quality factor of 50 and a resonance frequency of 360 Hz, the power output will be half of the peak power, if there is a frequency mismatch of 3.6 Hz. A reasonable 1.0 Hz frequency tolerance translates to an approximate 3.6 micrometer tolerance for the thickness dimension on the 0.5 mm thick beam, assuming that all other dimensions are held perfectly to the specification. This level of precision increases the cost of the harvester and decreases its applicability in many markets. The holes 34 in the proof mass 24 are receptacles for discrete masses of different sizes and densities which change the resonance frequency of the resonator 12.

Resonance modes of the mounting base 14 and proof mass 24 can adversely influence the performance of the resonator 12 if they lie in the frequency range for which the resonator 12 is designed to operate. The mounting base 14 is therefore designed such that resonance modes dictated primarily by its structure will be much higher than that of the resonator's spring-proof mass resonance frequency. To achieve this, the mounting base 14 may be designed to be stiff relative to its mass. The mounting base 14 may be constructed with a thick cross-section, shown by the lines marked O, to maximize its first moment of area which in turn defines its flexural stiffness. The base 14 can be constructed from the same material as the single-degree-of-freedom resonator 12 or can be a different material. The preferred materials are ones that have low intrinsic damping and high fatigue resistance. For example, steel generally exhibits a good combination of these two characteristics. As described above, the material of the mounting base 14 may comprise, for example, a metal, a plastic, or a composite material. According to various aspects, it may be preferable that the base 14 comprise a material with low damping such as, for example, brass, steel, titanium, or aluminum or other metals.

According to some aspects, the mounting base 14 and the resonator 12 are separately constructed components. One end surface of the resonator 12 includes an arch 48. An end surface of the mounting base 14 includes an arch 50 opposing the arch 48, thereby forming a substantially circular hole 46. A pin 16 (FIG. 2) may be inserted into a hole 46 formed by the arches 48, 50 to create a compression fitting to hold the resonator 12 together with the base 14. Another arch 52 may be formed at the opposite end of the resonator 12 relative to the arch 48, and the base 14 may include a notched-out arch 52. The arch 52 formed on the resonator may fit into the complementary notched-out arch in the base 54 for a compression fitting at the end of the resonator opposite the insertion point (i.e., hole 46) of the pin 16.

In an exemplary embodiment, a threaded fastener 56 (FIGS. 1 and 2) may be used to attach the base 14 to host structure 15. The fastener 56 may preferably be located below the center of mass of the energy harvester 10 and be oriented parallel to the idealized straight line motion of the proof mass 24. In some aspects, the fastener size may preferably be a 10-32 or ¼-28 fastener.

The proof mass 24 is designed such that its structural resonance modes are well above the resonance frequency of the resonator's spring-proof mass resonance frequency. Thus, the proof mass 24 is relatively rigid. The proof mass 24 accounts for a majority of the energy harvester's volume. Thus parasitic mass may be reduced and the power output of the resonator 12 increased. The channels 28, 28', 28'' provide clearance around the perimeter of the proof mass 24 so that the proof mass 24 does not impact the surrounding structure. The clearance between the proof mass 24 and the surrounding structure may typically be on the order of 0.1-5 mm.

The beam 22 has a substantially flat surface facing the piezoelectric element 18 so that a thin piezoelectric element 18 can be bonded to the beam 22. It should be appreciate that the piezoelectric element 18 may preferably be attached to the beam 22 using an adhesive or solder bond, but any suitable means may be used. The flexing of the beam 22 creates a strain in the piezoelectric transducers. Based on the properties of the piezoelectric material, the strain induces an electric charge at the transducers electrodes (not shown). The electrodes can be connected to electronic circuitry 20 (FIG. 2) allowing the charge to be extracted and placed across an electronic load (not shown). In an exemplary embodiment, the energy harvester 10 uses a piezoelectric material with electrodes that are perpendicular to the primary direction of strain experience by the beam 22. Since the electric field generated in the piezoelectric material is proportional to the strain, the voltage at the electrodes is minimized by using thin layers of material. In this configuration, the d31 piezoelectric constant defines the relationship between strain and electric field. Since thin layers are also required in this configuration, the piezoelectric material is attached directly to the surface of the beam. Piezoelectric elements are generally diced into thin elements that have a uniform cross-section and flat mounting surfaces.

In another embodiment for the piezoelectric transducer 18, piezo fiber composites are used instead of bulk piezoelectric elements. In these composites, piezoelectric fibers are embedded in a plastic laminated package. The laminated package has arrays of electrodes on its surfaces. The piezo fiber composites can be bonded to the beam in a similar way to the bulk piezoelectric elements. This configuration uses the d33 coupling because the piezoelectric material can be poled in parallel with the fibers.

In yet another embodiment of the piezoelectric transducers 18, one or more piezoelectric element(s) can be attached to either or both sides of the beams 22. The piezoelectric elements can be wired in series or parallel to adjust the voltage and current that delivered to the circuit. The piezoelectric element(s) preferably have either a PMN-PT composition or a PZT composition. Soft piezoelectric materials such as PZT-5H are used for low frequency applications where maximizing charge density per strain is important. Hard piezoelectric such as PZT-5A is used for higher frequency applications where intrinsic losses in the material's electromechanical transduction are minimized. The use of piezoelectric transducers to convert mechanical energy to electrical energy is well known in the art and will not be discussed further.

Figure 9:
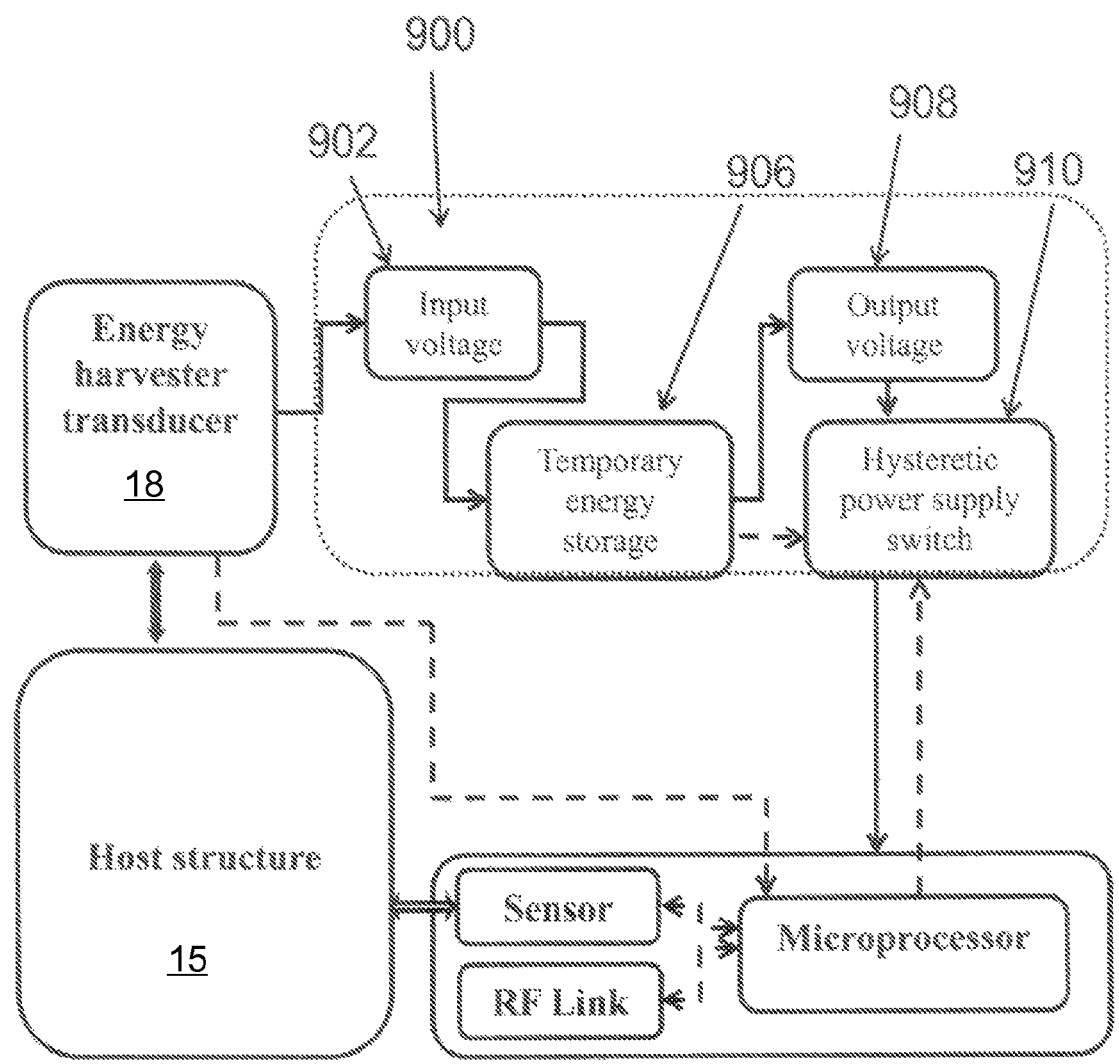
FIG. 9 is a block diagram illustrating an exemplary configuration of the energy harvester's circuitry.

In an exemplary embodiment of the energy harvester circuitry 20, shown in FIG. 9, energy is harvested from the electromechanical transducer using an electrical circuit 900 that includes an input voltage protection 902 such as a diode bridge, a power conditioner 904 such as a DC-DC converter, an energy storage element 906, a voltage regulator 908, and an output switch 910. Input voltage protection and overvoltage protection for the storage element are also included in the circuit 900. The input voltage protection 902 (e.g., a diode bridge) provides rectification of the voltage waveform from the energy harvester transducer. The uni-polar rectified waveform is fed to one or more input capacitors that act as a voltage filter so that a steady DC voltage is available for the power conditioner 904 (e.g., DC-DC converter). The power conditioner 904 optimally transfers energy from the input capacitor (s) which are at variable voltages to a much large size energy storage element that is typically used within a narrow voltage range. The energy storage element 906 provides an energy reservoir so that the load can draw power that is much higher than that supplied by the harvester for short durations. This is needed because the electrical load is generally determined by its specific application and it is often much higher than that which is available directly from the energy transducer. However, these loads are typically required for a brief period of time, which allows for a duty cycle operation that balances the harvester-load energy budget. The load can either be connected directly with the energy reservoir or an additional voltage regulator can be used between the reservoir and the load. This is necessary for many applications because the energy reservoir voltage often fluctuates with the amount of energy stored while the load requires an input voltage that is fixed. In addition to the regulator, a hysteretic power supply switch is required that provides conductivity from the energy storage element or voltage regulator to the load. The hysteresis is provided by a comparator circuit and is based on the energy stored at the storage element. Energy stored is typically related to the voltage, particularly in the typical case of a battery or capacitor.

One exemplary implementation of the bridge may be an array of low voltage Schottky diodes in a full or half bridge arrangement. The input capacitor(s) are ceramic. The exemplary DC-DC converter uses a non-synchronous Buck Boost or non-synchronous Boost style topology. The exemplary energy storage element 906 is a capacitor or rechargeable battery. Various types of capacitors including tantalum, electrolytic, ultra-capacitors, and ceramic capacitors can be used in this application. The output voltage regulator 908 is preferably a regulated switching power supply.

The circuit is preferably located in a region that is remote to the load path between the host structure 15 and the proof mass 24. The electrical connection is preferably in the form of a sealed detachable connector or a wire with a strain relief.

Figure 10:
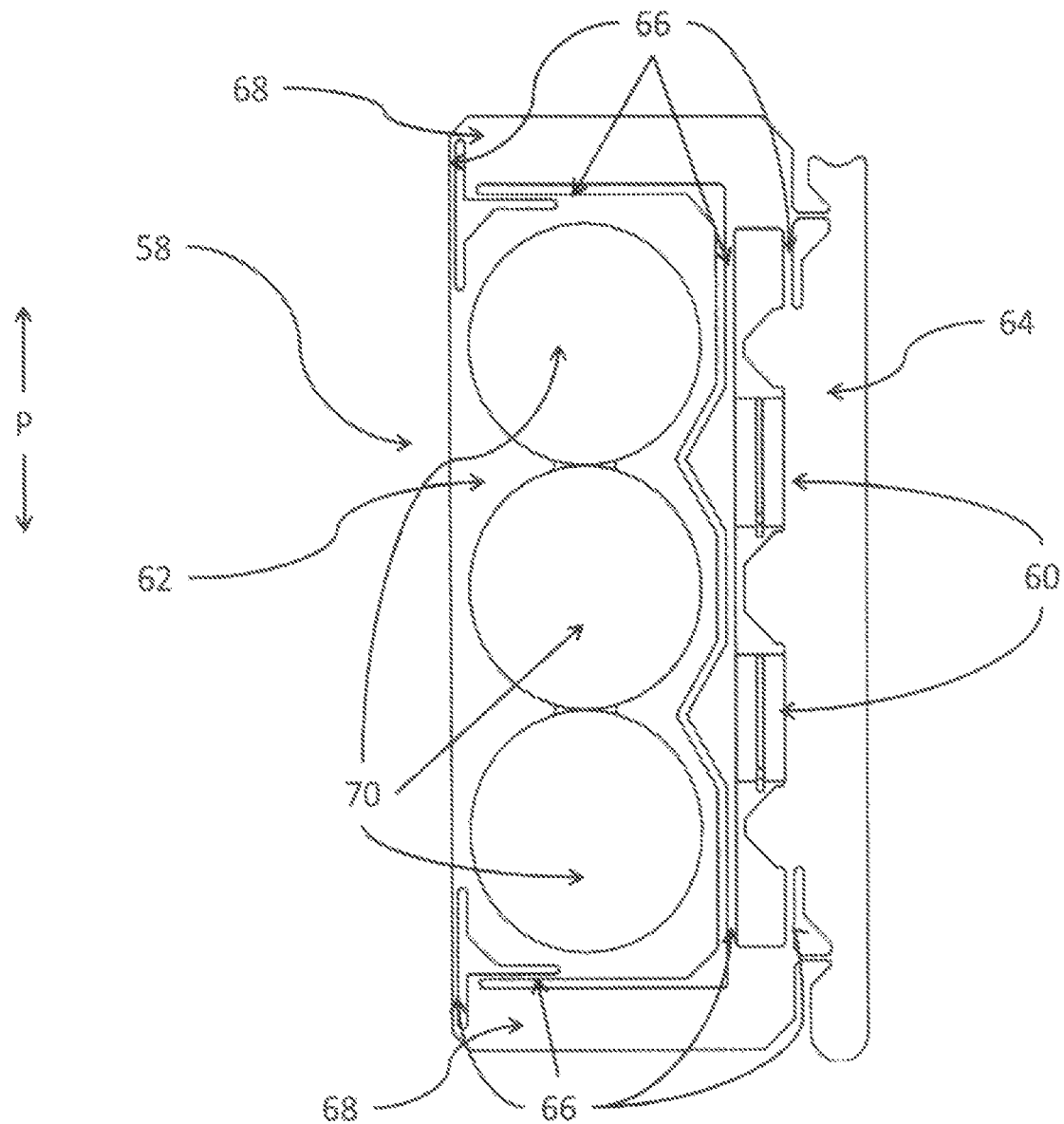
FIG. 10 is an exemplary embodiment of the resonator with the piezoelectric transducers configured to produce electric charge from shear.

Referring to FIG. 10, another exemplary embodiment of the monolithic single degree of freedom resonator 58 is shown. In this embodiment, the electromechanical transducers 60 are placed between the proof mass 62 and the rigid backplane 64 and are mounted to both. As the proof mass 62 is excited and moves in a direction parallel to the rigid backplane 26, as indicated by P, the piezoelectric transducers experience a shear force which induces an electrical charge between the terminals (not shown) of the transducers 60.

Several flexures 66 are once again used to connect the proof mass 62, beam-springs 68 and rigid backplane 64 to each other. The flexures are again used to define the stiffness and linearity of the resonator. Holes 70 in the proof mass for resonance frequency tuning are also included.

Figure 11:
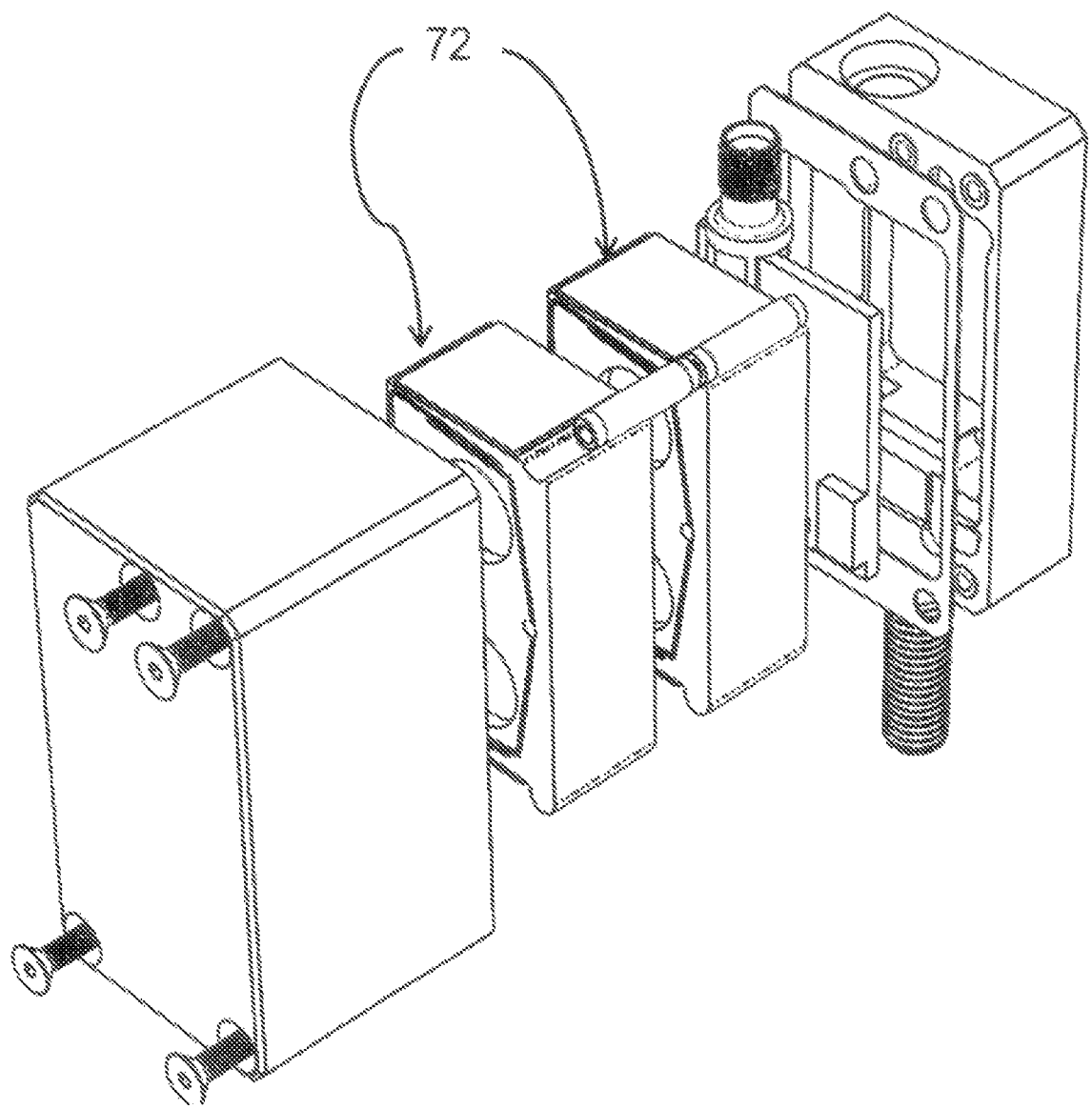
FIG. 11 is an exploded view of an exemplary embodiment of the energy harvester invention with multiple resonators within the same housing.
Figure 12:
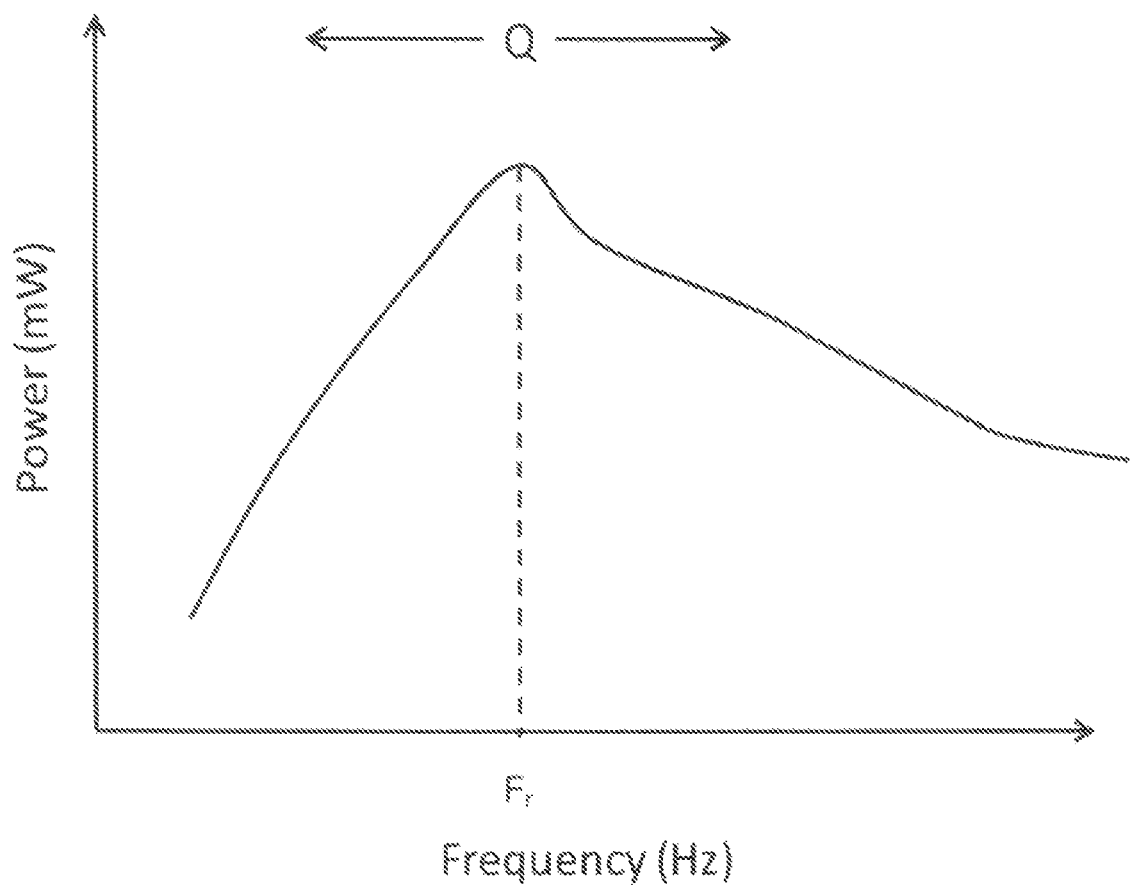
FIG. 12 is a graph representing the power output of an idealize harvester with a single resonator and resonance frequency.
Figure 13:
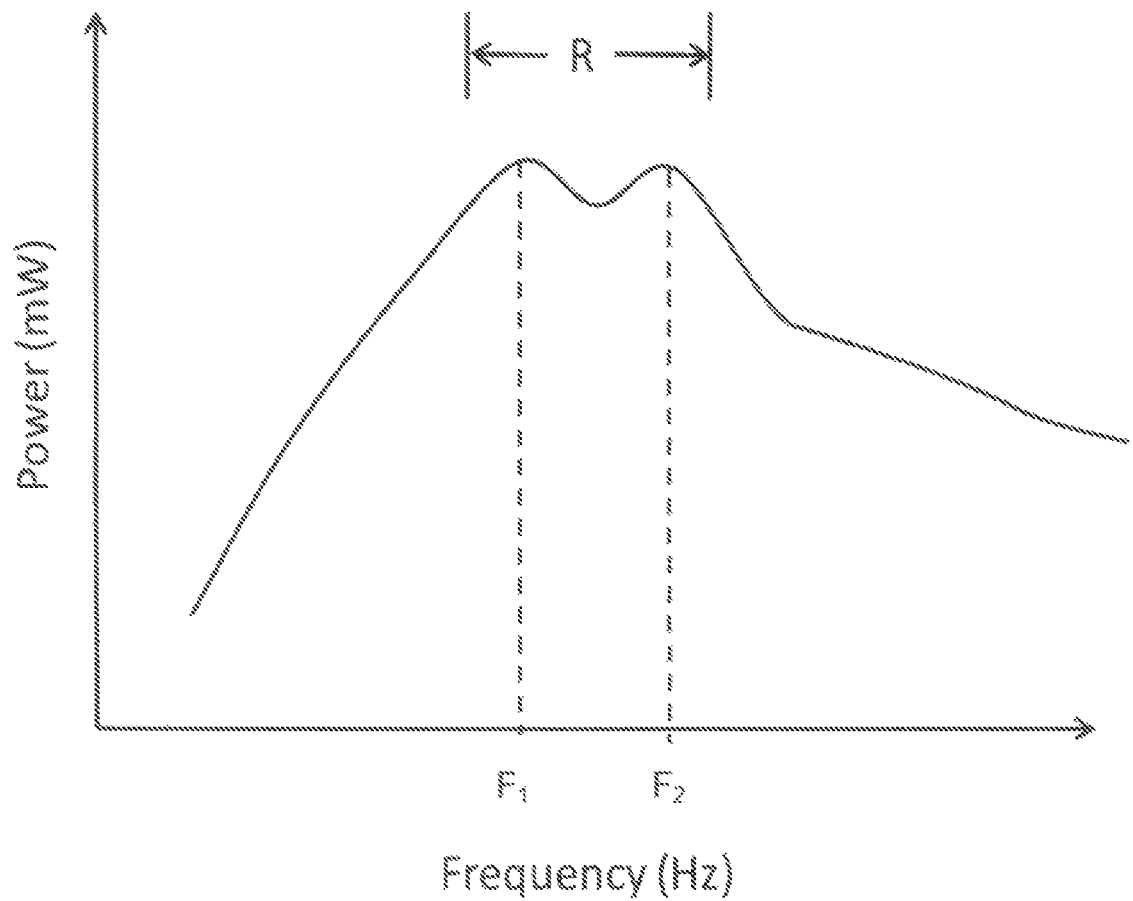
FIG. 13 is a graph representing the power output of an idealize harvester with a two resonator each designed with a separate resonance frequency.

FIG. 11 represents another exemplary embodiment of the energy harvester. Here multiple resonators 72 are constructed from the monolithic building block. Two resonators are shown but more may be included. This allows the energy harvester to produce peak power over a larger vibration bandwidth. FIG. 12 shows a typical single resonator embodiments power output where the maximum power output is associated with the resonators single resonance frequency. By changing the resonance frequency, the peak power output can be move in the frequency band as shown by arrows Q. However, FIG.

13 shows the inventions power band when two resonators are included in the same housing each tuned to a separate resonance frequency thus allowing the energy harvester to be designed to have more than one vibration frequency in which peak power is generated. In this case a wider power band can be generated, as shown by arrows R. The power band can be configured by choosing and/or adjusting the difference between the two resonance frequencies $F_1$, $F_2$.

Figure 14:
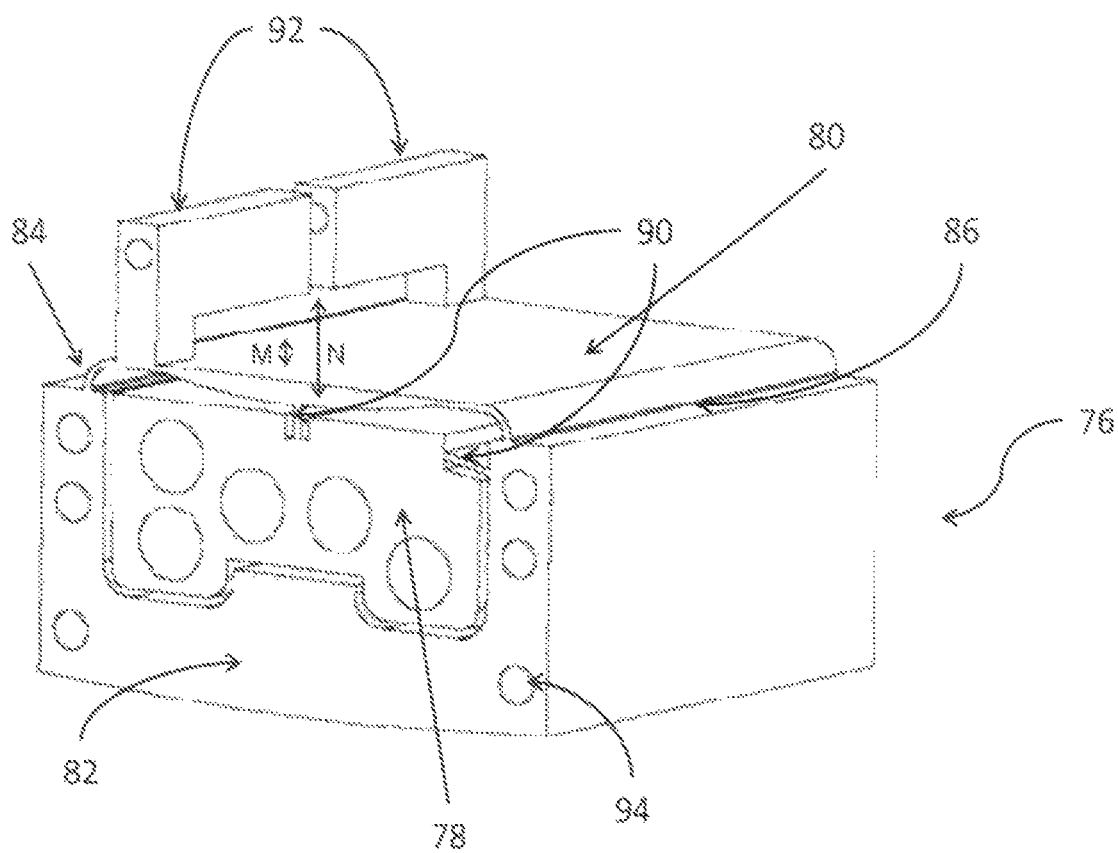
FIG. 14 is an exemplary embodiment of the resonator with the proof mass suspended from the center of the beam spring system with levers for frequency tuning.

Referring now to FIG. 14, another exemplary embodiment of the resonator 76 is shown in which the proof mass 78 is attached to the center of a beam spring 80 which is supported by the rigid structure 82 at both ends 84, 86. Flexures 90 are again used to connect the elements and define the resonators degree of freedom. Two levers 92 are incorporated for frequency tuning and holes 94 in the rigid base structure 82 are used to reduce the parasitic mass of the resonator.

Figure 15:
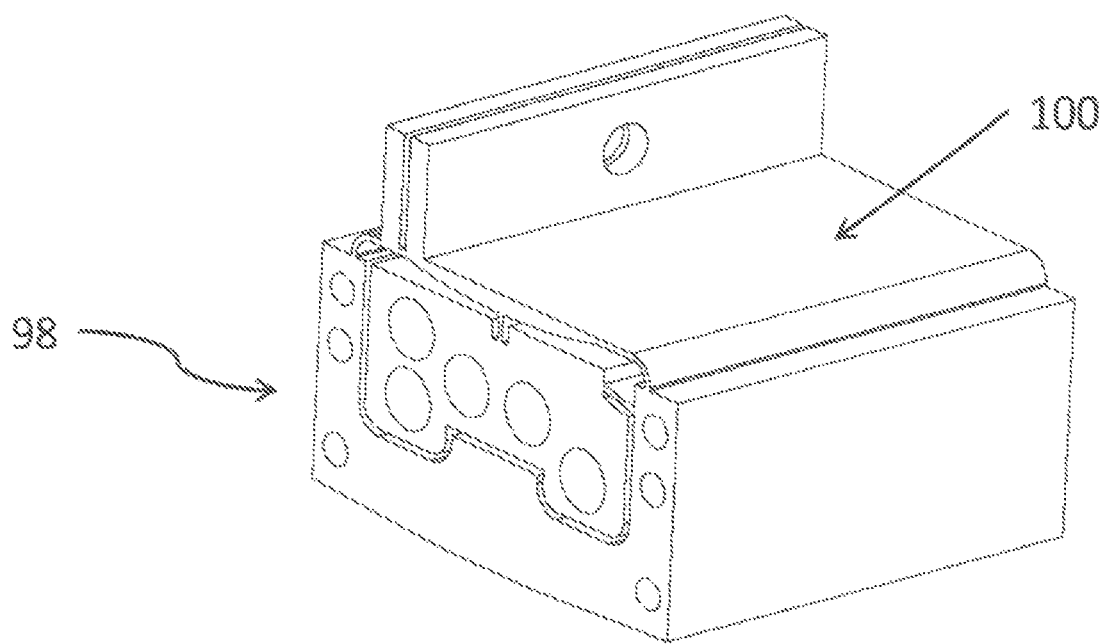
FIG. 15 illustrates the use of levers to adjust the resonators resonance frequency.

Referring now to FIG. 15, two levers can be included as an additional frequency tuning mechanism to induce curvature in the beam. The curvature can be induced in parallel or normal to the axis of curvature of the beam's resonance mode. In the parallel case 96, the curvature induced in the beam 80 causes the beam to experience higher membrane stresses for a given vibration level which in turn increases its effective stiffness. For the normal case 98, bending increases the beam's 100 cross-sectional first moment of area, which increases the beam stiffness. Practical implementation of this tuning method is straightforward because movement of the two levers 92 relative to one another as shown by lines can be achieved with a simple fastener that stretches between the levers. The fastener pulls the ends of the two levers together or pushes them apart.

Figure 16:
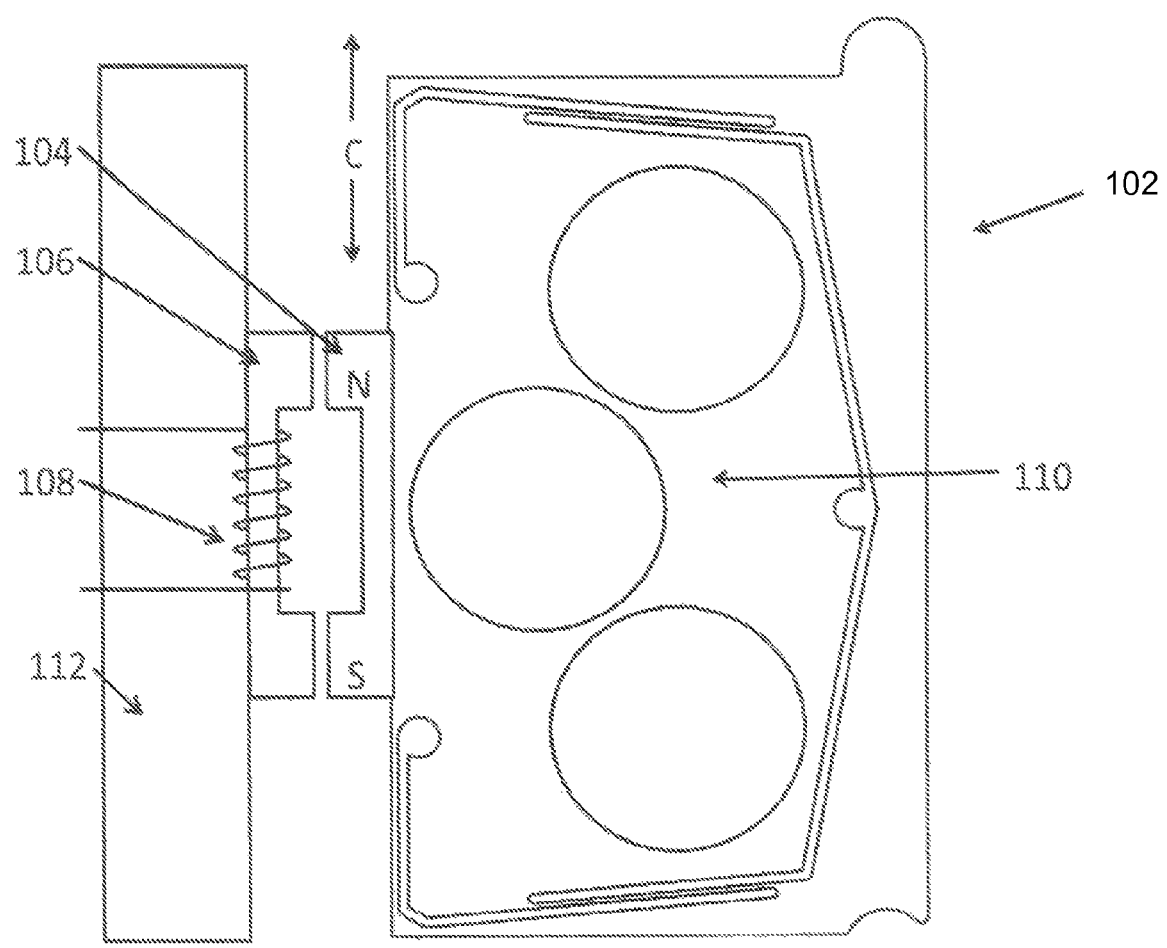
FIG. 16 is an exemplary embodiment of an energy harvester in accordance with aspects of the disclosure.

Referring now to FIG. 16, another exemplary embodiment of the invention, an electromagnetic device 102 is used to extract energy from the moving mass or beam. The electromagnetic transducer consists of a permanent magnet 104 or magnetic device and a wire coil 108. Movement of the magnet relative to the 108 coil causes variation in the magnetic field in the proximity of the coil 108. This in turn induces current flow through the coil 108 according to Maxwell's equations. The wire coil 108 can include a magnetically permeable core 106 to enhance the electromagnetic coupling in the coil 108. The coil 108 may be mounted on the proof mass 110 and the magnet 104 on the mounting base 112. Alternatively, the coil 108 may be mounted on the mounting base 112 and the magnet 104 mounted on the proof mass 110.

From the foregoing, it will be appreciated that, although specific embodiments have been described herein for purposes of illustration, various modifications or variations may be made without deviating from the spirit or scope of inventive features claimed herein. Other embodiments will be apparent to those skilled in the art from consideration of the specification and figures and practice of the arrangements disclosed herein. It is intended that the specification and disclosed examples be considered as exemplary only, with a true inventive scope and spirit being indicated by the following claims and their equivalents.

What is claimed is:

1. An apparatus for harvesting energy from vibratory motion of a host structure, the apparatus comprising:
   a vibration resonator, the resonator having a monolithic construction including
   a rigid structure;
   at least one spring member connected with the rigid structure, the spring member including a beam member having a first portion connected with the rigid structure; and
   a proof mass, the proof mass being connected with the beam member such that the proof mass is coupled with the rigid structure,
   wherein a portion of the proof mass, the at least one spring member, and the rigid structure are fabricated from a single piece of material.

2. The apparatus of claim 1, wherein the beam member extend from the rigid structure in a cantilevered manner.

3. The apparatus of claim 2, wherein the beam member includes a first end and a second end.

4. The apparatus of claim 3, wherein said first portion of the beam member connected with the rigid structure is the first end.

5. The apparatus of claim 3, wherein the proof mass is connected with the second end of the beam member.

6. The apparatus of claim 1, further comprising an electromechanical transducer coupled with the resonator and configured to convert vibratory energy of the resonator to electrical energy.

7. The apparatus of claim 6, wherein the electromechanical transducer comprises a piezoelectric element.

8. The apparatus of claim 1, wherein the beam member includes a first end and a second end, the first end comprising said first portion of the beam spring.

9. The apparatus of claim 8, wherein the first end has a thicker cross-section and higher stiffness than the second end.

10. The apparatus of claim 6, further comprising an electrical circuit, the circuit being collocated with the energy harvester transducer in a single housing.

11. The apparatus of claim 1, further comprising a mounting surface configured to interface with a host structure.

12. The apparatus of claim 11, wherein the resonator is configured such that the fundamental resonant direction of motion of the proof mass is perpendicular to the mounting surface.

13. The apparatus of claim 1, wherein the proof mass accounts for a majority of the total mass and/or total volume of the energy harvester.

14. The apparatus of claim 1, wherein the proof mass is configured with receptacles to accept additional mass for frequency tuning of the resonator.

15. The apparatus of claim 1, further comprising at least one mounting member configured to fasten the apparatus to a host structure.

16. The apparatus of claim 15, wherein the proof mass has a center gravity centered over the at least one mounting member.

* * * * *